United States Patent [19]

Mogi

[11] Patent Number: 5,287,303
[45] Date of Patent: Feb. 15, 1994

[54] SCR TYPE MEMORY APPARATUS

[75] Inventor: Takayuki Mogi, Kanagawa, Japan

[73] Assignee: Sony Corporation, Tokyo, Japan

[21] Appl. No.: 931,799

[22] Filed: Aug. 18, 1992

[30] Foreign Application Priority Data

Aug. 21, 1991 [JP] Japan ................................ 3-233846

[51] Int. Cl.$^5$ .............................................. G11C 13/00
[52] U.S. Cl. ...................................... 365/179; 365/174
[58] Field of Search .................... 365/182, 179, 189.01, 365/174

[56] References Cited

U.S. PATENT DOCUMENTS 4,635,087  1/1887  Birrittella, et al.
5,239,501  8/1993  Matsui et al. .................. 365/154

Primary Examiner—Terrell W. Fears
Attorney, Agent, or Firm—Hill, Steadman & Simpson

[57] ABSTRACT

An SCR type memory apparatus which is short in access time, easy in setting current values upon reading and writing and easy in constructing a peripheral circuit with less power supply voltage limitation is described. The semiconductor memory apparatus comprises of a basic cell circuit which includes an SCR type memory cell. The SCR type memory cell includes a pair of pnp transistors and a pair of double emitter transistors. The basic cell circuit also includes a pair of write npn transistors. The collector of each write npn transistor is connected to a voltage holding node of the SCR type memory cell and the base is connected to a word selecting line.

3 Claims, 5 Drawing Sheets

SCR TYPE MEMORY APPARATUS

BACKGROUND OF THE INVENTION

1. Field of the Invention

This invention relates to a semiconductor memory apparatus, and more particularly to a semiconductor memory apparatus suitably used to operate SCR type memory cells at a high speed.

2. Description of the Prior Art

An SCR type memory cell shown in FIG. 1 is conventionally employed as a memory cell for storing information therein. It is formed from a pair of pnp transistors and a pair of double emitter transistors, and one of the two emitters of each of the double emitter transistors is connected to a terminal 2. When the SCR type memory cell is used in a selecting circuit, the terminals 2 are connected individually to bit lines BL1 and BL2 represented by short dash lines in FIG. 1.

A typical memory cell selecting circuit which is constituted using conventional SCR type memory cells is shown in FIG. 2. Referring to FIG. 2, since generally a large number of memory cells (loads) are assigned to each word selecting line UWL, the access time to a memory cell can be decreased to raise the throughput by decreasing the amplitude between the select and deselect word lines. The case is considered now where the first memory cell 11 connected to a word selecting line UWL1 is in a selected condition, the second memory cell 12 connected to another word selecting line UWL2 is in a deselected condition, the memory cells 11 and 12 have internal voltage values shown in FIG. 2.

As shown in FIG. 2, the voltage value of the word selecting line UWL1 is $-2\ Vf \approx -1.6$ volts; the voltage value of the low side of the first memory cell 11 is $-3\ Vf \approx -2.4$ volts; and the voltage value of the high side of the first memory 11 is $-2\ Vf \approx -1.6$ volts, the voltage value of the word deselecting line UWL2 is $-2\ Vf-1.1$ volts $\approx -2.7$ volts; the voltage of the low side of the second memory cell 12 is $-3\ Vf-1.1$ volts $\approx -3.5$ volts; and the voltage value of the high side of the second memory 12 is $-2\ Vf-1.1$ volts $\approx -2.7$ volts.

Normally, the amplitude between the select and deselect word selecting lines UWL is determined by the low side voltage value of a selected memory cell and the high side voltage value of a deselected memory cell. For example, when the base potential of a transistor Q1 which is the holding node of the selected memory cell in FIG. 2 is low and the base potential of transistor Q3 which is the holding node of the deselected memory cell is high, the word selecting line amplitude is 1.1 volts.

In this case, the base potential of transistor Q1 is equal to the low side voltage value $= -3\ Vf \approx -2.4$ volts while the base potential of transistor Q3 is equal to the high side voltage value $= -2\ Vf-1.1$ volts $\approx -2.7$ volts, and the potential of the low side of the selected memory cell is higher than the potential of the high side of the deselected memory cell. Consequently, upon writing write current flows from the emitter of the transistor Q1 so that the transistor Q1 is turned from off state to an on state, thereby to allow normal writing of data.

If the word selecting line amplitude is set, for example, to 0.6 volts in order to realize higher throughput with such a selecting circuit as described, the base potential of the transistor Q1 is equal to the low side voltage value $= -3\ Vf \approx -2.4$ volts and the base potential of the transistor Q3 is equal to the high side base potential $= -2\ Vf-0.6$ volts $\approx -2.2$ volts. Consequently, the potential of the high side of the deselected memory cell is higher than the potential of the low side of the selected memory cell. As a result, the write current does not flows not from the emitter of the transistor Q1 which is a target upon such writing but flows from the emitter of the deselected transistor Q3. Therefore, there is a potential problem that, if the amplitude between word selecting lines is reduced in order to realize higher throughput, then a write error may occur in this manner.

From the above discussions, when such a conventional SCR type memory cell as described above is employed, the word selecting line amplitude must be at least higher than 1.1 volts, including a margin of about 0.3 volts (0.8 volts + 0.3 volts = 1.1 volts) taking dispersion and other factors into consideration. This results in increase of time required for selection of a memory cell and hence in increase of access time, which is disadvantageous for the memory apparatus.

Furthermore, since write/read bit lines are common, current values upon reading and writing must be set to individually suitable set values while the write side bit line voltage is low at $-4\ Vf\ (\approx -3.2$ volts$)$. Designing a peripheral circuit which operates on a power supply voltage of ($4\ Vf - V_{EE}$) for writing and reading operations is difficult.

Also, when data are to be written into a selected memory cell, transistor Q1 must be turned from an off to on state as described above and the emitter potential of the transistor Q1 must be lowered below $-4\ Vf \approx -3.2$ volts. This makes it very difficult to construct a write controlling circuit which operates on very low power voltage supply, when the emitter potential of the transistor Q1 is low.

SUMMARY OF THE INVENTION

The first object of the present invention is to provide an SCR type memory apparatus which is short in access time.

The second object of the present invention is to provide an SCR type memory apparatus which can set current values upon reading and writing.

The third object of the present invention to provide an SCR type memory apparatus which makes construction of peripheral circuits easy.

To attain the objects, a semiconductor memory apparatus is provided which comprises of (1) a plurality of SCR type memory cells each including a pair of pnp transistors and a pair of double emitter transistors, (2) a pair of write bit lines, (3) a pair of npn transistors provided for each of the SCR type memory cells and serving as transistors only for writing information into the SCR memory cell, the collectors of the npn transistor pair being individually connected to voltage holding nodes of the SCR memory cell while the bases are individually connected to one of the word selecting lines, (4) a pair of first terminals to which ones of the two emitters of each npn transistors in each SCR type memory cells is individually connected, (5) a pair of second terminals to which the emitters of the write npn transistors of (3) are individually connected, (6) a pair of read bit lines individually connected to the first terminals, and a pair of write bit lines separated from the read bit lines and individually connected to the second terminals.

The SCR type memory cell is made up of two mirror images of a half cell. Preferably, the bases of the double emitter transistors of each of half cell are formed in the same regions as the collectors of the pnp transistors, the collectors are formed in the same regions as the collectors of the npn transistors and the bases of the pnp transistors, and the bases of the npn transistors are formed in the same region as the emitters of the pnp transistors.

In another aspect of the present invention, a semiconductor memory apparatus is provided which comprises an SCR type memory cell including a pair of pnp transistors, a pair of double emitter transistors, and a pair of write npn transistors. The collector of each write npn transistor is connected to a voltage holding node of the SCR type memory cell and the base is connected to a word selecting line.

With the semiconductor memory apparatus, write current flows without fail from one of the pair of write transistors whose base is connected to the word selecting line which has a higher potential. Accordingly, even if the word selecting line amplitude is greatly reduced, the semiconductor memory apparatus can still operate well at a high speed, and the access time can be reduced. Furthermore, setting of currents upon reading and writing of the semiconductor memory apparatus is facilitated and a power supply can be constructed readily, and accordingly, the degree of freedom in designing a peripheral circuit significantly.

The above and other objects, features and advantages of the present invention will become apparent from the following description and the appended claims.

DESCRIPTION OF THE PREFERRED EMBODIMENT

Figure 1:
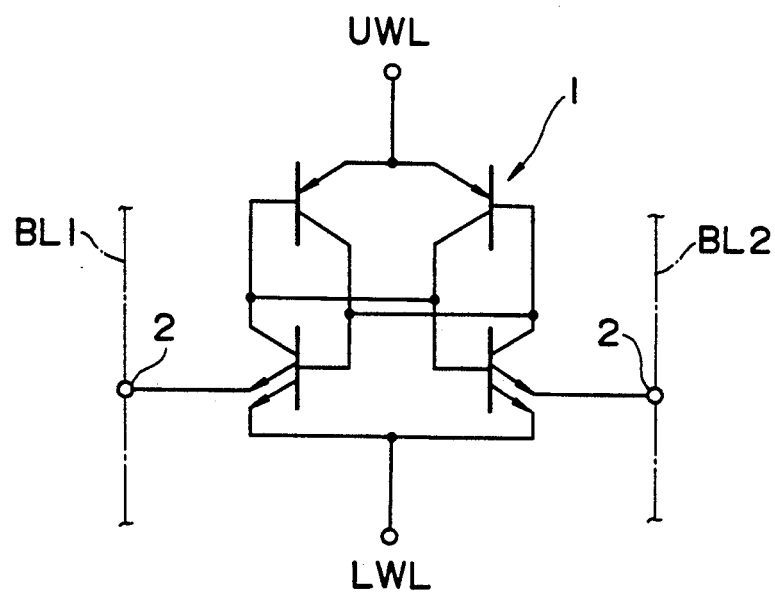
FIG. 1 is a circuit diagram of a conventional SCR type memory cell.
Figure 2:
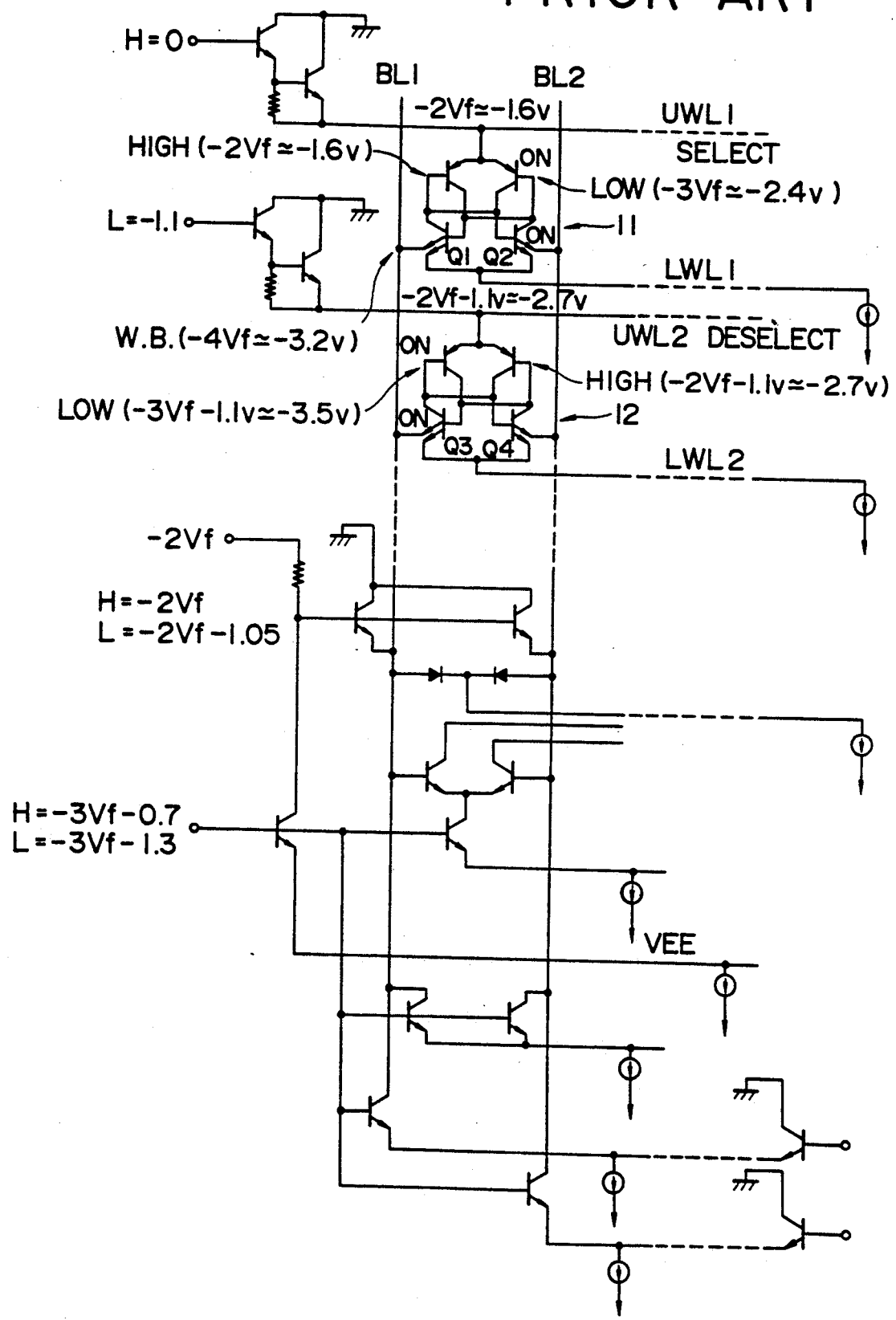
FIG. 2 is a circuit diagram of a typical conventional selecting circuit which is formed using the conventional memory cell shown in FIG. 1.
Figure 3:
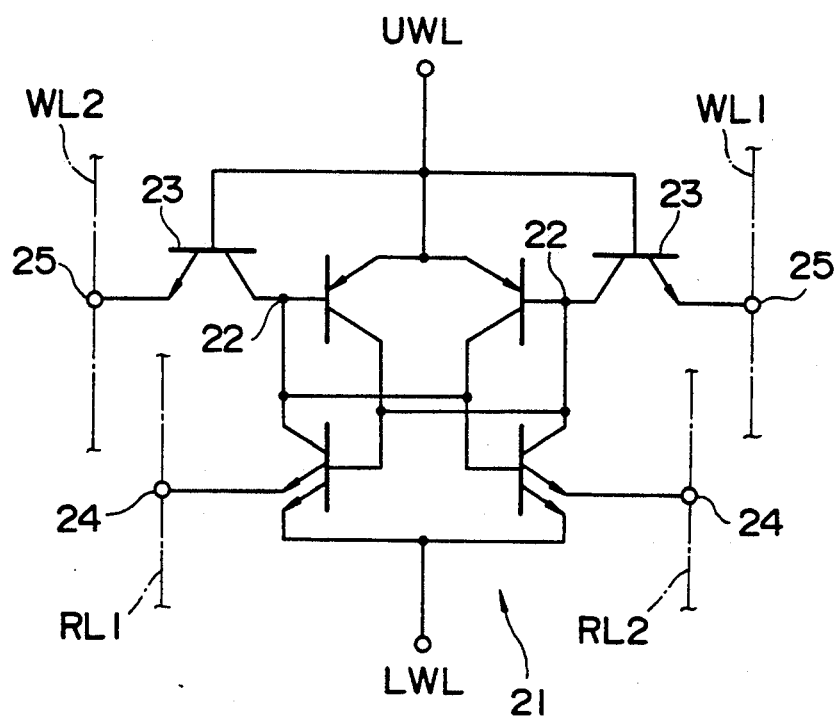
FIG. 3 is a circuit diagram of an SCR type semiconductor memory apparatus showing a preferred embodiment of the present invention.

Referring first to FIG. 3, there is shown an SCR type semiconductor memory apparatus in which the present invention is applied is shown in FIG. 2. The semiconductor memory apparatus shown includes a pair of write transistors 23 in addition to an SCR type memory cell 21 which is similar to the conventional SCR type memory cell 1 described hereinabove with reference to FIG. 1.

Each of the write transistors 23 is an npn transistor whose collector is connected to a corresponding holding voltage nodes 22 of SCR memory cell 21. The bases of the write transistors 23 are connected commonly to a word selecting line UWL, and the emitters of the write transistors 23 are individually connected to a pair of second terminals 25. The second terminals 25 are individually connected to a pair of write bit lines WL2 and WL1 represented by dash lines in FIG. 3.

One of the two emitters of each double emitter transistors in the SCR type memory cell 21 is connected to a corresponding first terminal 24, and the first terminals 24 are individually connected to read bit lines RL1 and RL2.

Figure 4:
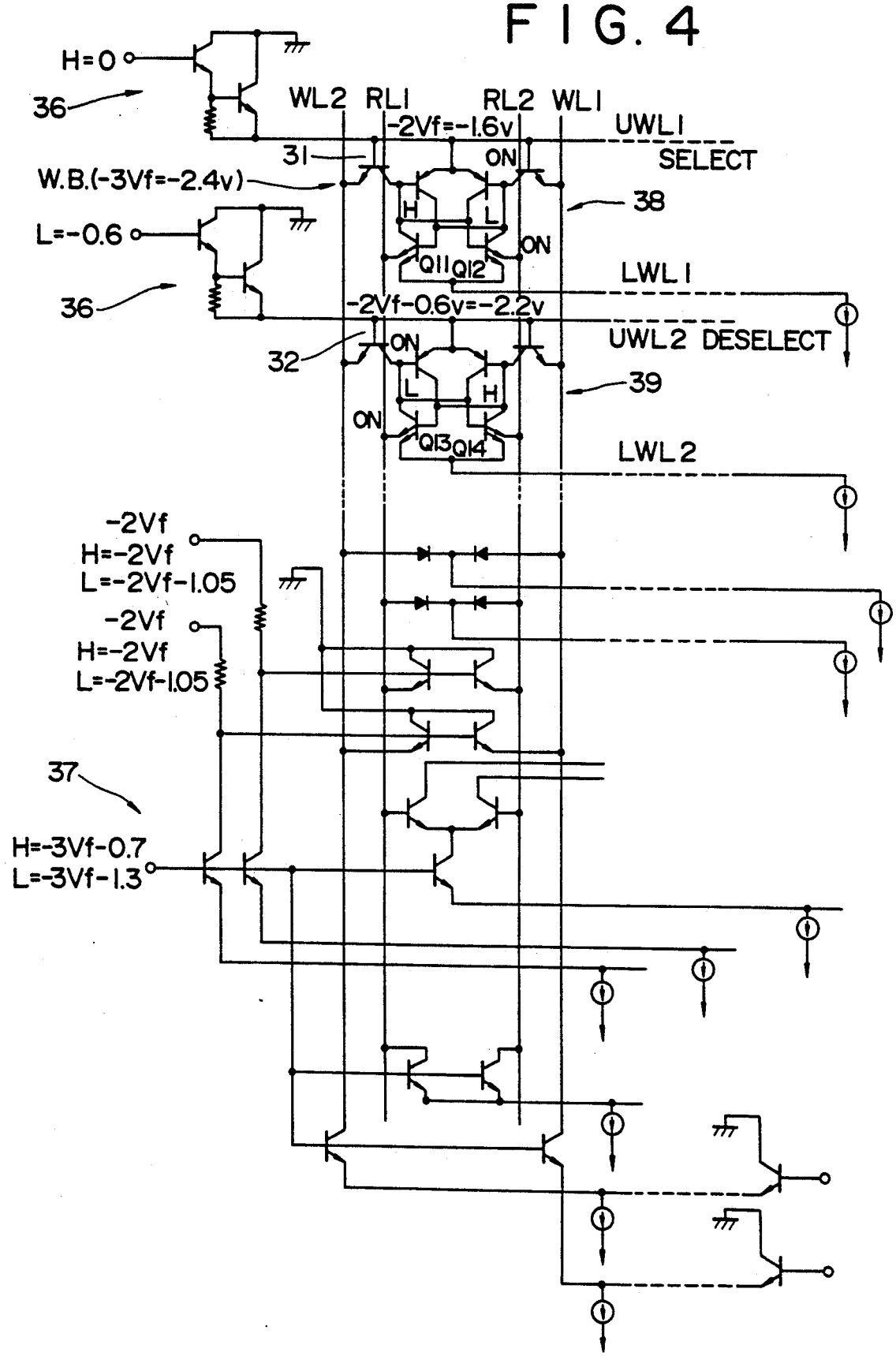
FIG. 4 is a circuit diagram of a selecting circuit which is formed using the SCR type semiconductor memory apparatus shown in FIG. 3.

A selecting circuit constructed with the memory cell described above is shown in FIG. 4. Referring to FIG. 4, the case is now considered where the base potential of transistor Q11 is low and the potential of transistor Q13 is high, a first memory cell 38 connected to the word selecting line UWL1 is selected and a second memory cell 39 connected to the word selecting line UWL2 is deselected similarly as in the conventional selecting circuit shown in FIG. 2.

Similar to the conventional memory cell described before the word selecting line amplitude is determined by the low side voltage value of a selected memory cell and the high side voltage value of a deselected memory cell. However, with the memory cell according to the present invention, since the bases of a pair of npn transistors 31 and 32 provided only for writing operations, are connected to the word selecting lines UWL1 and UWL2 respectively, the write current flows without fail from the write transistor 13 whose base is connected to the word selecting line UWL which is higher in potential (select side).

Consequently, even if a margin of 0.3 volts or so is added taking a dispersion and other factors into consideration, the amplitude between the word selecting lines UWL can be made equal to 0.6 volts or so, and consequently, the access time can be reduced to increase the throughput.

Furthermore, upon writing of data, it is only necessary to turn the write transistor 31 on to change over the high side node and to lower the emitter potential of the write transistor 31 below $-3\ Vf \approx -2.4$ volts, and consequently, it is possible to raise the emitter potential of the write transistor 31 by Vf compared to the conventional circuit. Hence, a write controlling circuit with less power supply voltage limitation can be constructed easily.

Figure 5:
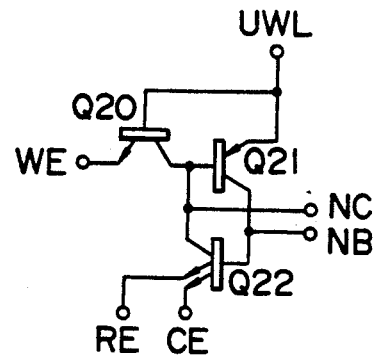
FIG. 5 is a circuit diagram of a half memory cell in the SCR type semiconductor memory apparatus shown in FIG. 3.

The basic cell of the SCR type semiconductor memory apparatus of the present invention is described in more detail below. FIG. 5 shows one half of the basic cell circuit shown in FIG. 3. The memory cell shown in FIG. 3 is completed by connecting two mirror images of such half basic cell circuit along a virtical line of symmetry in FIG. 5.

The half memory cell shown in FIG. 5 consists of three transistors including a write transistor Q20, a double emitter transistor Q22 constituting an SCR, and transistor Q21.

Figure 6:
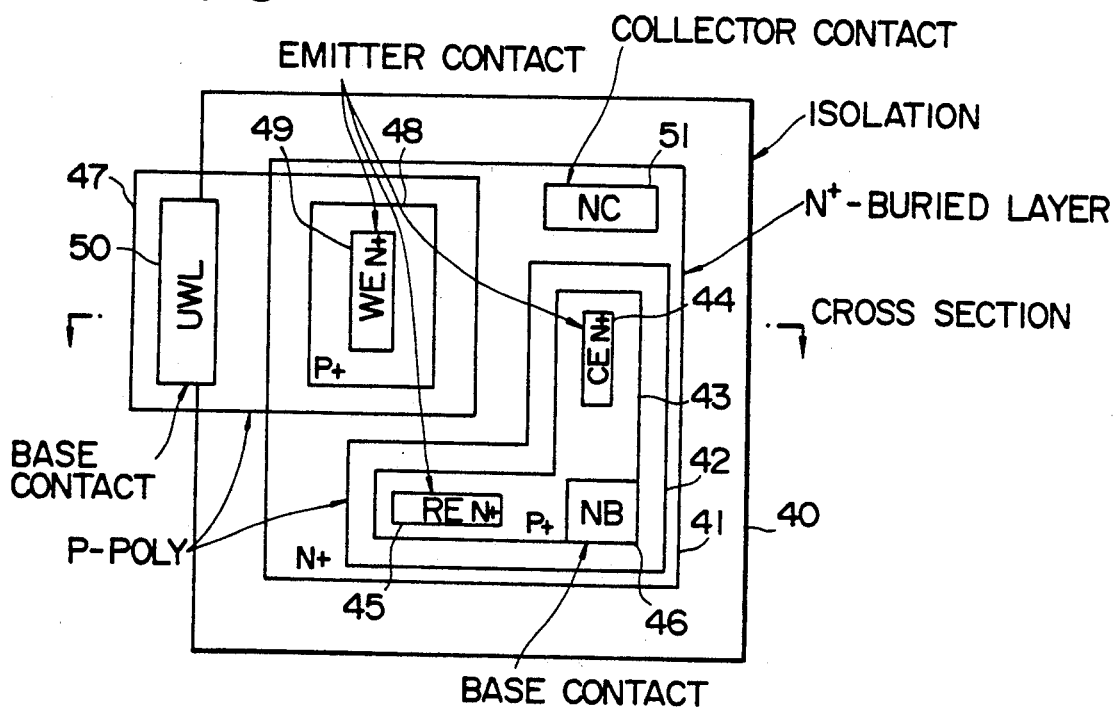
FIG. 6 is a top plan view of the half memory cell shown in FIG. 5.
Figure 7:
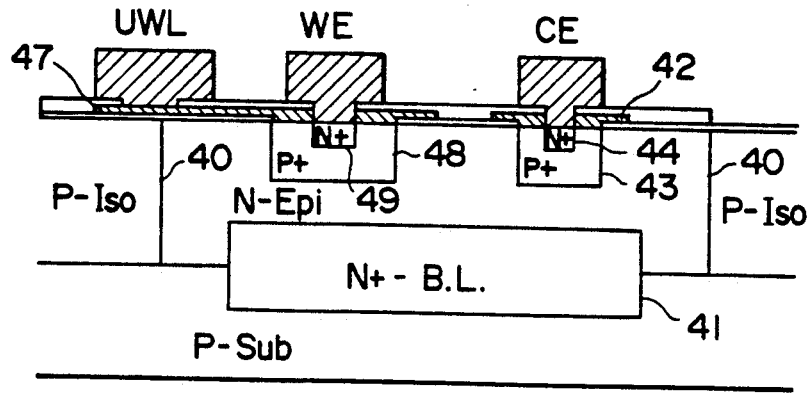
FIG. 7 is a cross sectional view of the half memory cell of the pattern shown in FIG. 6.

The top plan of a pattern of the half memory cell shown in FIG. 5 is shown in FIG. 6. A vertical section of the pattern of the half memory cell is shown in FIG. 7.

Referring to FIG. 6, the base of the npn transistor Q20 is formed from a p+ region 48; the emitter from an n+ connect region 49; and the collector from an NC region 51.

The emitter of the pnp transistor Q21 is formed from a p+ region 48; the base from an NC region 51; and the collector from an NB region 43.

The emitter of the double emitter npn transistor Q22 is formed from an RE region 45 and a CE region 44; the base from p+ region 43; and the collector from an NC region 51.

As can be seen clearly from the top plan view of FIG. 6, the base of the npn transistor Q20 and the emitter of the pnp transistor Q21 are formed from the same diffused region, and the base 43 of the npn transistor Q22 and the collector 43 of the pnp transistor Q21 are formed from the same region, and the collector 51 of the transistor Q22 is formed from the same region as the collector 51 of the transistor Q20 and the base 51 of the transistor Q21.

The vertical section of the half memory cell corresponding to the top plan view of FIG. 6 is shown in FIG. 7. Referring to FIG. 7, an N-Epi layer is formed on a substrate P-Sub, and the half memory cell is formed on the N-Epi layer isolated from the other cells by P-Iso layers.

While the isolation in the sectional view shown in FIG. 7 is formed from a p+ diffused layer, each element may alternatively be isolated using some other means such as a trench, and the isolation is not limited to the p+ diffused layer.

It is to be noted that, one memory cell includes a total of 8 transistors which is an increase of two transistors compared to the conventional memory cell circuit. However, the emitter of the pnp transistor and the base of the write transistor 31 can be formed common and the base of the pnp transistor and the collector of the write transistor 31 can be formed common. Hence, the transistors can be constructed without substantially increasing the pattern layout area.

Having now fully described the invention, it will be apparent to one of ordinary skill in the art that many changes and modifications can be made thereto without departing from the spirit and scope of the invention as set forth herein.

What is claimed is:

1. A semiconductor memory apparatus, comprising:
   (a) a plurality of SCR type memory cells each including a pair of pnp transistors and a pair of double emitter transistor operatively coupled together and forming a voltage holding node at the base of each pnp transistor;
   (b) at least two word selecting lines;
   (c) a pair of npn transistors provided for each of said SCR type memory cells and serving as transistors provided only for writing information into the SCR memory cell, each collector of each npn transistor of said pair of npn transistors being individually connected to a respective voltage holding node of the SCR memory cell and the bases of both npn transistors of said pair of npn transistors being commonly connected to one of said word selecting lines;
   (d) a pair of write bit lines, each emitter of said npn transistors in each SCR type memory cell being separately connected to a respective write bit line; and
   (e) a pair of read bit lines, one emitter of each double emitter transistor of each SCR type memory cell being separately connected to a respective read bit line.

2. A semiconductor of memory apparatus according to claim 1, where the bases of said double emitter transistors in each of said SCR type half memory cells are formed in the same regions as the collectors of said pup transistors, the collectors of said double emitter transistors are formed in the same regions as the collectors of said npn transistors and the bases of said pnp transistors, and the bases of said npn write transistors are formed in the same region as the emitters of said pnp transistors.

3. A semiconductor memory apparatus, comprising:
   an SCR type memory cell including a pair of pnp transistors and a pair of double emitter transistors operatively coupled together and forming voltage holding nodes at the bases of the pnp transistor;
   word selecting line; and
   a pair of write npn transistors each of which having a collector that is connected to a respective voltage holding node of said SCR type memory cell and a base that is connected to the word selecting line.

* * * * *